(12) United States Patent
Park et al.

(10) Patent No.: US 6,744,197 B2
(45) Date of Patent: Jun. 1, 2004

(54) ORGANIC ELECTROLUMINESCENT DISPLAY DEVICE AND METHOD OF FABRICATING THE SAME

(75) Inventors: Jae-Yong Park, Gyeonggi-do (KR); Nam-Yang Lee, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/329,500

(22) Filed: Dec. 27, 2002

(65) Prior Publication Data

US 2003/0205969 A1 Nov. 6, 2003

(30) Foreign Application Priority Data

May 3, 2002 (KR) ................. 10-2002-0024550

(51) Int. Cl.$^7$ ................................ H01J 1/62
(52) U.S. Cl. ................. 313/504; 313/506; 313/512
(58) Field of Search ................. 313/498, 504, 313/505, 506, 512

*Primary Examiner*—Vip Patel
(74) *Attorney, Agent, or Firm*—Morgan Lewis & Bockius, LLP

(57) ABSTRACT

An organic electroluminescent display (ELD) device includes a first substrate, a second substrate spaced apart and facing the first substrate, a plurality of switching thin film transistors and a plurality of driving thin film transistors interconnected on the first substrate, each of the switching thin film transistor and the driving thin film transistor having an active layer, a gate electrode, a source electrode, and a drain electrode, the drain electrode of the driving thin film transistor being extended to the pixel region to have an extended portion, a contact electrode contacting the extended portion of the drain electrode of the driving thin film transistor, a first electrode formed on the second substrate, an organic light-emitting layer on the first electrode, and a second electrode on the organic light-emitting layer.

16 Claims, 14 Drawing Sheets

ORGANIC ELECTROLUMINESCENT DISPLAY DEVICE AND METHOD OF FABRICATING THE SAME

The present invention claims the benefit of Korean Patent Application No. 2002-24550, filed in Korea on May 3, 2002, which is hereby incorporated by reference.

BACKGROUND OF THE INVENTION

1. Field of the Invention

The present invention relates to a flat panel display device and more particularly, to an organic electroluminescent display (ELD) device and method of fabricating the same.

2. Discussion of the Related Art

In general, organic electroluminescent display (ELD) devices have electron-input electrodes (cathodes) and hole-input electrodes (anodes). The electrons and the holes are input into light-emitting layers from the cathode and anode electrodes, respectively, thereby forming an exciton. The organic electroluminescent display (ELD) devices emit light when the exciton is reduced from an excited state level to a ground state level. Since the organic electroluminescent display (ELD) devices do not need additional light sources, as compared to thin film liquid crystal display (LCD) devices, volume and weight of the organic electroluminescent display (ELD) devices can be reduced. In addition, the organic electroluminescent display (ELD) devices are advantageous with respect to their lower power consumption, high luminance, fast response time, and low weight. Accordingly, the organic electroluminescent display (ELD) devices can be implemented in mobile telecommunication terminals, car navigation systems (CNGs), personal digital assistants (PDAs), camcorders, and palm computers. In addition, since manufacturing processes for the organic electroluminescent display (ELD) devices are simple, manufacturing costs can be reduced. The organic electroluminescent display (ELD) devices can be classified into passive matrix-type and active matrix-type devices. Although the passive matrix-type organic electroluminescent display (ELD) devices have simple structures and manufacturing processes are simplified, they require high power consumption and are not suitable for large-sized display devices. In addition, aperture ratios decrease as the number of conductive lines increase. On the other hand, the active matrix-type organic electroluminescent display (ELD) devices have high light-emitting efficiency and high image display quality.

FIG. 1 is cross sectional view of an organic electroluminescent display (ELD) device according to the related art. In FIG. 1, the organic electroluminescent display (ELD) device 10 has a transparent first substrate 12, thin film transistor array part 14, a first electrode 16, an organic light-emitting layer 18, and a second electrode 20, wherein the thin film transistor array part 14 is formed on the transparent first substrate 12. A first electrode 16, an organic light-emitting layer 18, and a second electrode 20 are formed over the thin film transistor array part 14, and the light-emitting layer 18 displays red (R), green (G), and blue (B) colored light, and is commonly formed by patterning organic material separately for each pixel for R (red), G (green) and B (blue). A second substrate 28 has a moisture absorbent desiccant 22. The organic electroluminescent display (ELD) device 10 is completed by bonding the first and second substrates 12 and 28 together by disposing a sealant 26 between the first and second substrates 12 and 28. The moisture absorbent desiccant 22 removes moisture and oxygen that may infiltrate into an interior of the organic electroluminescent display (ELD) device 10. The moisture absorbent desiccant 22 is formed by etching away a portion of the second substrate 28, filling the etched portion of the second substrate 28 with moisture absorbent desiccant material, and fixing the moisture absorbent desiccant material by tape 25.

FIG. 2 is a plan view of a thin film transistor array pixel part of an organic electroluminescent display (ELD) device according to the related art. In FIG. 2, the thin film transistor array part of the organic electroluminescent display (ELD) device has a switching element $T_S$, a driving element $T_D$, and a storage capacitor $C_{ST}$ at every pixel region "P" that is defined on a substrate 12. The switching element $T_S$ and the driving element $T_D$ may be formed with combinations of more than two thin film transistors. The substrate 12 is formed of transparent material, such as glass and plastic. A gate line 32 is formed along a first direction, and a data line 34 is formed along a second direction perpendicular to the first direction. The data line 34 crosses the gate line perpendicularly with an insulating layer between the gate and data lines 32 and 34, and a power line 35 is formed along the second direction to be spaced apart from the data line 34. Thin film transistors are used for the switching element $T_S$ and the driving element $T_D$, wherein the thin film transistor for the switching element $T_S$ has a gate electrode 36, an active layer 40, a source electrode 46, and a drain electrode 50, and the thin film transistor for the driving element $T_D$ has a gate electrode 38, an active layer 42, a source electrode 48, and a drain electrode 52. The gate electrode 36 of the switching element $T_S$ is electrically connected to the gate line 32, and the source electrode 46 of the switching element $T_S$ is electrically connected to the data line 34. The drain electrode 50 of the switching element $T_S$ is electrically connected to the gate electrode 38 of the driving element $T_D$ through a contact hole 54, and the source electrode 48 of the driving element $T_D$ is electrically connected to the power line 35 through a contact hole 56. The drain electrode 52 of the driving element $T_D$ is electrically connected to a first electrode 16 in the pixel regions "P," and the power line 35 and a first capacitor electrode 15 formed of a polycrystalline silicon layer forms a storage capacitor $C_{ST}$.

FIG. 3 is a cross sectional view along III—III of FIG. 2 according to the related art. In FIG. 3, a buffer layer 14 is formed on a substrate 12 and a thin film transistor $T_D$ is formed on the buffer layer 14. The thin film transistor $T_D$ has a gate electrode 38, an active layer 42, a source electrode 56, and a drain electrode 52. An active layer 42 is formed on the buffer layer 14, and a second insulating layer 37 is formed on the active layer 42. A gate electrode 38 is formed on the second insulating layer 37, and third and fourth insulating layers 39 and 41 are sequentially formed over the gate electrode 38. The source and drain electrodes 56 and 52 are formed on the fourth insulating layer 41. A power line 35 is formed between the third and fourth insulating layers 39 and 41 to contact the source electrode 56. A fifth insulating layer 57 is formed on an entire surface of the substrate 12 on which the source and drain electrodes 56 and 52 are formed. A first electrode 16 is formed on the fifth insulating layer 57, and the first electrode 16 contacts the drain electrode 52 of the driving element. A light-emitting layer 18 that emits lights of specific wavelengths is formed on the first electrode 16, and a second electrode 20 is formed on the light-emitting layer 18. Before forming the light-emitting layer 18, a sixth insulating layer 58 is formed on the first electrode 16, and is patterned to expose a portion of the first electrode 16. The light-emitting layer 18 is formed on the exposed portion of the first electrode 16, and the second electrode 20 is formed over the entire substrate 12. A storage capacitor $C_{ST}$ is formed in parallel with the driving element $T_D$ and uses a power line 35 as a first capacitor electrode and a polycrystalline silicon pattern 15 as a second capacitor electrode 20.

The organic electroluminescent display (ELD) device is commonly manufactured by forming the thin film transistor array part and the light-emitting part on a same substrate, and then bonding the substrate to an encapsulation. If the thin film transistor array part and the light-emitting part are formed on the same substrate, a yield of a panel having the thin film transistor array part and the light-emitting part is dependent upon the product of individual yields of the thin film transistor array part and an yield of the light-emitting part. Accordingly, the yield of the panel is greatly affected by the yield of the organic light-emitting layer. For example, if an inferior organic light-emitting layer, which is usually formed of a thin film of 1000 Å approximately, has a defect owing to impurities and contaminants even when the thin film transistor is formed well, the panel is classified as a inferior panel. This leads to a waste of money and material that are expended for manufacturing the satisfactory thin film transistor, and decreases the yield of the panel.

Bottom emission-type organic electroluminescent display (ELD) devices have advantageous high stability and variable fabrication processes. However, the bottom emission-type organic electroluminescent display (ELD) devices are not adequate for display devices that require high resolution since there is limit on increasing aperture ratio. In the top emission-type organic electroluminescent display (ELD) devices, light is emitted upward of the substrate. Since the light is emitted along an opposite direction of the thin film transistor in the top emission-type devices, the light can be emitted without influencing the thin film transistor array part that is positioned under the light-emitting layer, thereby simplifying design of the thin film transistor. In addition, the aperture ratio can be increased and the operational life span of the organic electroluminescent display (ELD) device can be increased. However, since a cathode is commonly formed over the light-emitting layer in top emission-type devices, material selection and light transmittance are limited, thereby lowering light transmission efficiency. Moreover, if a thin film-type passivation layer is formed to prevent reduction of the light transmittance, the thin film passivation layer may fail to prevent infiltration of exterior moisture and air from outside.

SUMMARY OF THE INVENTION

Accordingly, the present invention is directed to an organic electroluminescent display (ELD) device and method of fabricatng the same that substantially obviates one or more of problems due to limitations and disadvantages of the related art.

An object of the present invention is to provide an organic electroluminescent display (ELD) device in which a thin film transistor array part and a light-emitting part are independently formed on different substrates.

Another object of the present invention is to provide a method of fabricating an organic electroluminescent display (ELD) device in which a thin film transistor array part and a light-emitting part are independently formed on different substrates.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent display (ELD) device includes a first substrate, a second substrate spaced apart and facing the first substrate, a plurality of switching thin film transistors and a plurality of driving thin film transistors interconnected on the first substrate, each of the switching thin film transistor and the driving thin film transistor having an active layer, a gate electrode, a source electrode, and a drain electrode, the drain electrode of the driving thin film transistor being extended to the pixel region to have an extended portion, a contact electrode contacting the extended portion of the drain electrode of the driving thin film transistor, a first electrode formed on the second substrate, an organic light-emitting layer on the first electrode, and a second electrode on the organic light-emitting layer.

In another aspect, A method of fabricating an organic electroluminescent display (ELD) device includes defining a plurality of pixel regions on first and second substrates, forming a plurality of switching thin film transistors and a plurality of driving thin film transistors interconnected on the first substrate, the switching thin film transistor and the driving thin film transistor each having an active layer, a gate electrode, a source electrode, and a drain electrode, the drain electrode of the driving thin film transistor being extended to the pixel region to have an extended portion, forming a contact electrode contacting the extended portion of the drain electrode of the driving thin film transistor, forming a first electrode on the second substrate, forming an organic light-emitting layer on the first electrode, forming a second electrode on the organic light-emitting layer, and bonding the first and second substrates so that the contact electrode of the first substrate contacts the second electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the illustrated embodiment of the present invention, which is illustrated in the accompanying drawings.

Figure 1:
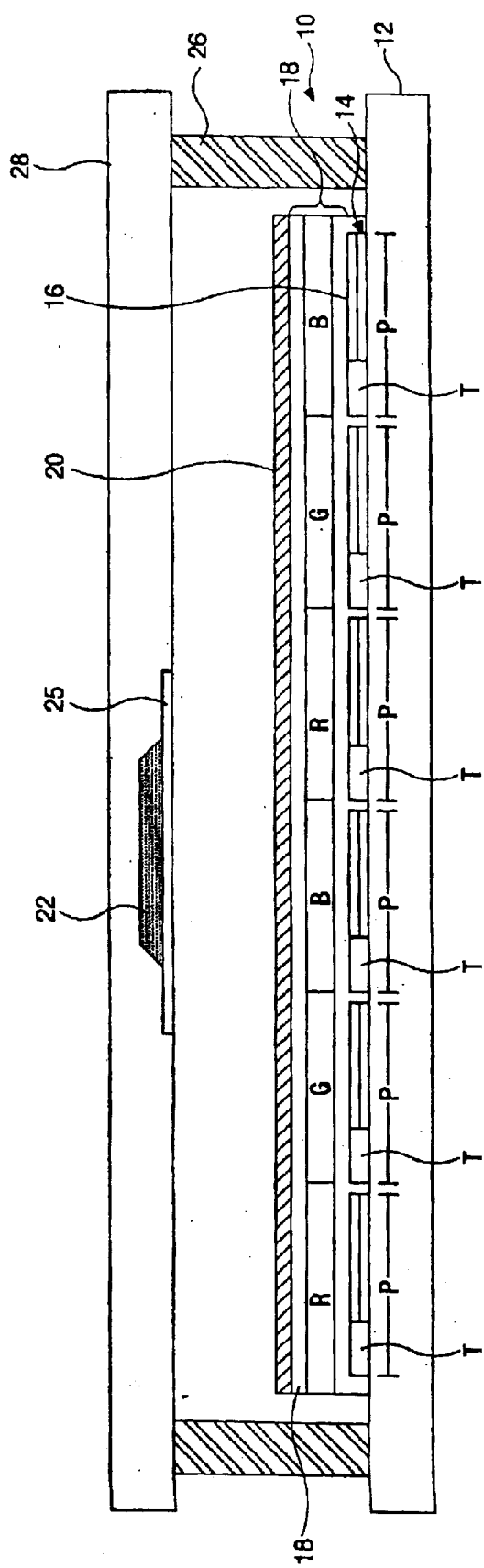
FIG. 1 is a cross sectional view of an organic electroluminescent display (ELD) device according to the related art.
Figure 2:
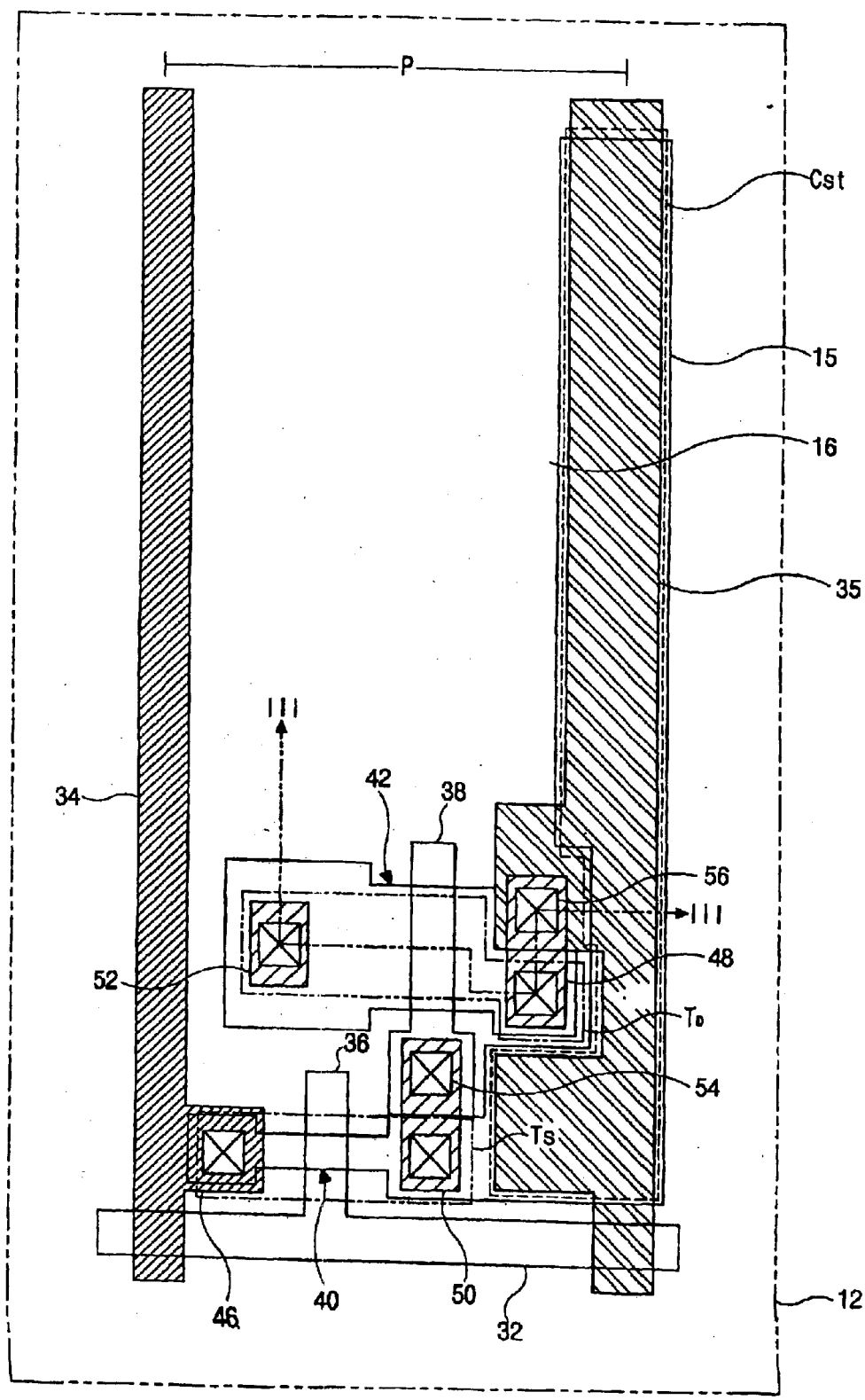
FIG. 2 is a plan view of a thin film transistor array pixel part of an organic electroluminescent display (ELD) device according to the related art.
Figure 3:
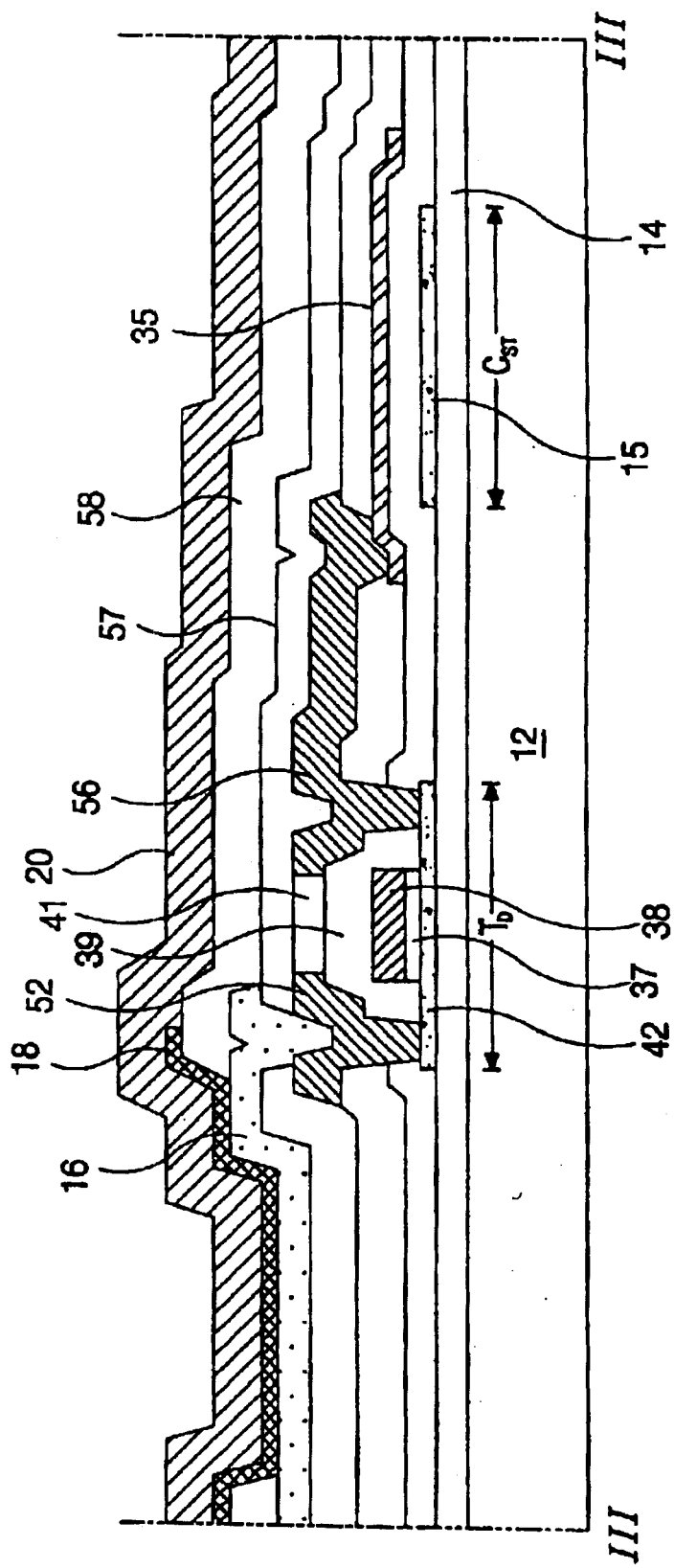
FIG. 3 is a cross sectional view along III—III of FIG. 2 according to the related art.
Figure 4:
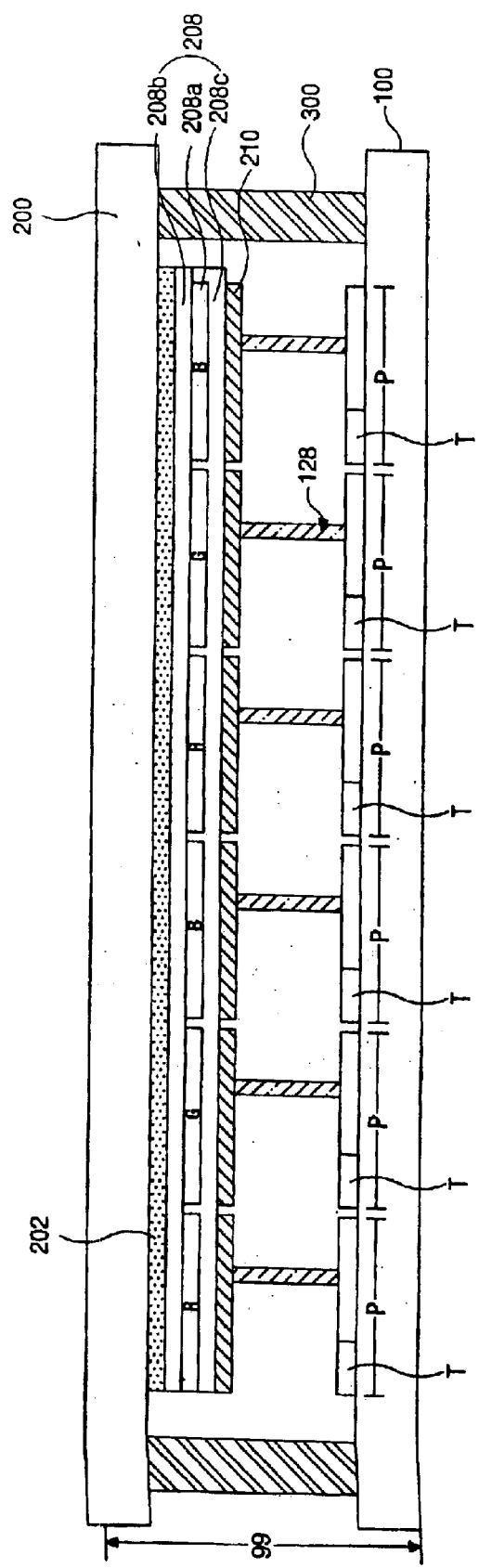
FIG. 4 is a cross sectional view of an exemplary organic electroluminescent display (ELD) device according to the present invention.

FIG. 4 is a cross sectional view of an exemplary organic electroluminescent display (ELD) device according to the present invention. In FIG. 4, an organic electroluminescent display (ELD) device 99 may include transparent first and second substrates 100 and 200 bonded together with a sealant 300. A plurality of pixel regions "P" may be defined on the first substrate 100, and a thin film transistor "T" functioning as a switching element and a driving element may be formed at each of the pixel regions "P." Although not shown, the first substrate 100 may include a plurality of array lines. A transparent first electrode 202 (anode) may be formed on an entire surface of the second substrate 200. An organic light-emitting layer 208 and a second electrode 210 (cathode) may be sequentially formed over the first electrode 202. Each divided portion R, G, and B of the light-emitting layer 208 may correspond to each of the pixel regions "P" of the first substrate 100, and may emit light of red, green, and blue. The light-emitting layer 208 may be formed as a single layer structure or as a multiple layer structure. If the light-emitting layer 208 includes a multiple layer structure, it may include a main light-emitting layer 208a, a hole carrying layer 208b, and an electron carrying layer 208c. The hole carrying layer 208b may be formed between the first electrode 202 and the main light-emitting layer 208a, and the electron carrying layer 208c may be formed between the main light-emitting layer 208a and the second electrode 210. The second electrode 210 and a drain electrode (not shown) of the driving element may be indirectly connected to each other through the contact electrode 128. The contact electrode 128 may be formed on the second electrode 210, or may be formed on an extended portion (not shown) of the drain electrode (not shown) of the driving element. If the first and second substrates 100 and 200 are bonded together after forming the contact electrode 128, the second electrode 210 may indirectly contact the drain electrode (not shown) by the contact electrode 128. Compared to the organic electroluminescent display (ELD) device in which the second electrode 210 is formed on the first substrate 100, it may not be necessary to form an additional passivation layer over the thin film transistor to protect the thin film transistor. In addition, it may not be necessary to form an insulating layer on the passivation layer according to the present invention.

Figure 5:
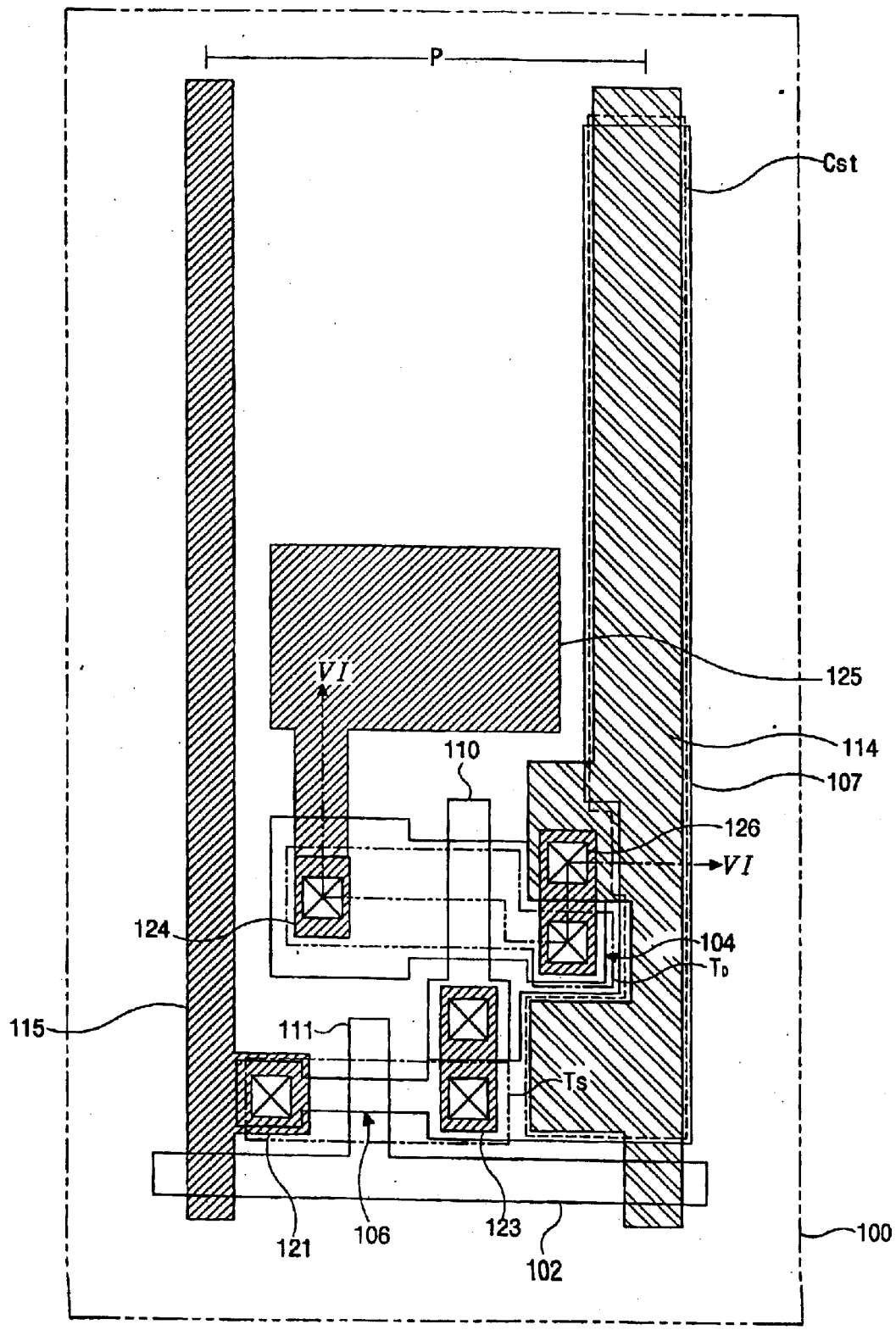
FIG. 5 is a plan view of an exemplary thin film transistor array pixel part of an organic electroluminescent display (ELD) device according to the present invention.

FIG. 5 is a plan view of an exemplary thin film transistor array pixel part of an organic electroluminescent display (ELD) device according to the present invention. In the exemplary thin film transistor array pixel part of FIG. 5, polycrystalline silicon thin film transistors may be used for a switching element $T_S$ and a driving element $T_D$. In FIG. 5, a gate line 102 may be formed on a substrate 100 along a horizontal direction, and a data line 115 and a power line 114 may be formed on the substrate 100 along a vertical direction perpendicular to the horizontal direction. The data line 115 and the power line 114 may be formed to cross the gate line 102, wherein the gate and data lines 102 and 115 define a pixel region "P" by crossing each other. A switching element $T_S$ and a driving element $T_D$ may be formed at a position adjacent to a cross point of the gate and data lines 102 and 115. The switching element $T_S$ may include an active layer 106, a gate electrode 110, a source electrode 121, and a drain electrode 123, and the driving element $T_D$ may include an active layer 104, a gate electrode 111, a source electrode 126, and a drain electrode 124. A storage capacitor $C_{ST}$ may be formed in parallel with the driving element $T_D$, and may be formed of a polycrystalline silicon active pattern 107 as a first capacitor electrode and the power line 114 as a second capacitor electrode. The source electrode 121 of the switching element may be electrically connected to the data line 115, and the drain electrode 123 may be electrically connected to the gate electrode 110 of the driving element $T_D$. The drain electrode 124 of the driving element $T_D$ may include an extended portion 125 formed within the pixel region "P," wherein a shape of the extended portion 125 may be modified into diverse shapes. In addition, the contact electrode 128 of FIG. 4 may be formed on the extended portion 125 or may contact the extended portion 125.

Figure 6A:
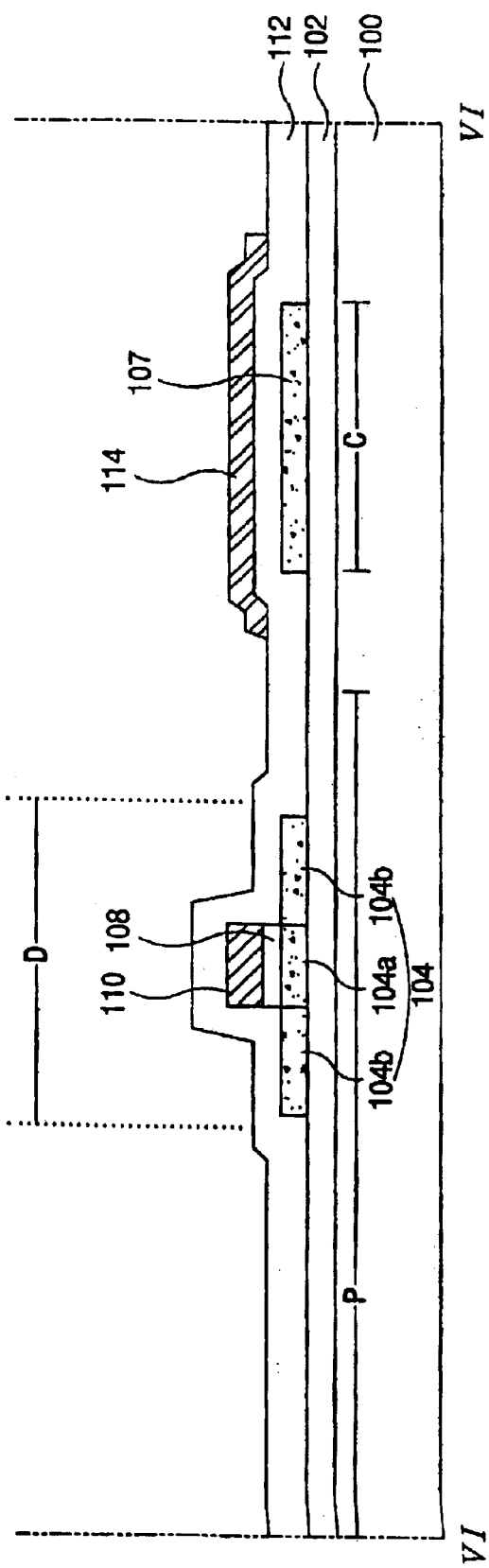
FIGS. 6A to 6C are cross sectional views along VI—VI of FIG. 5 and illustrate an exemplary fabrication process of a thin film transistor array part of an organic electroluminescent display (ELD) device according to the present invention.
Figure 6B:
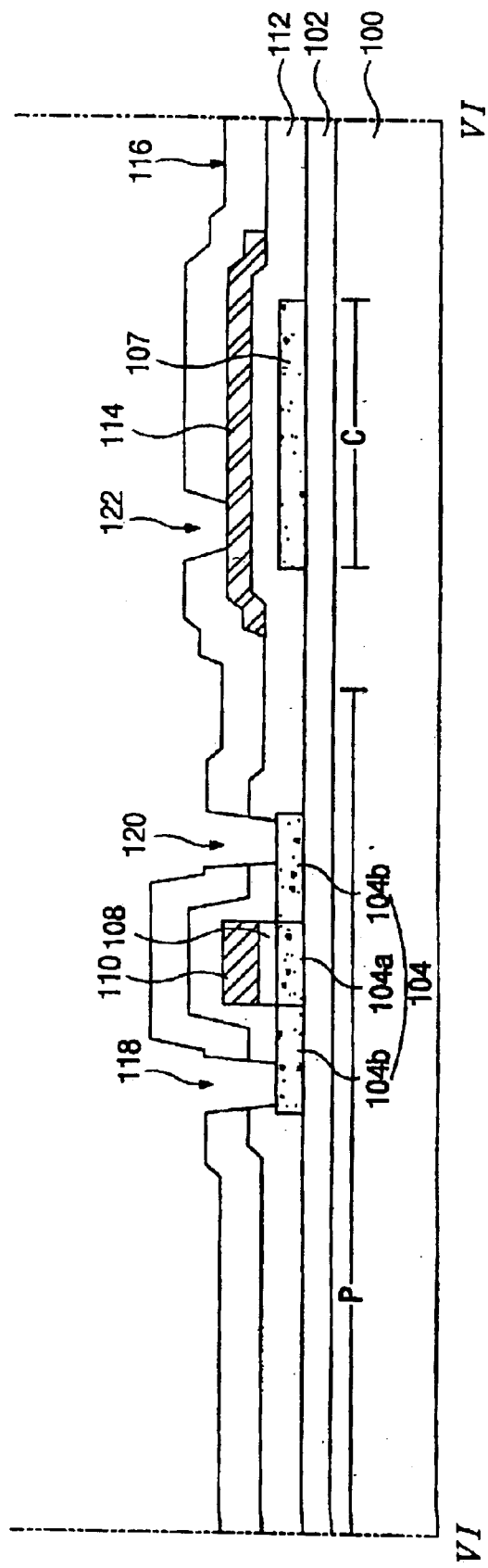
Figure 6C:
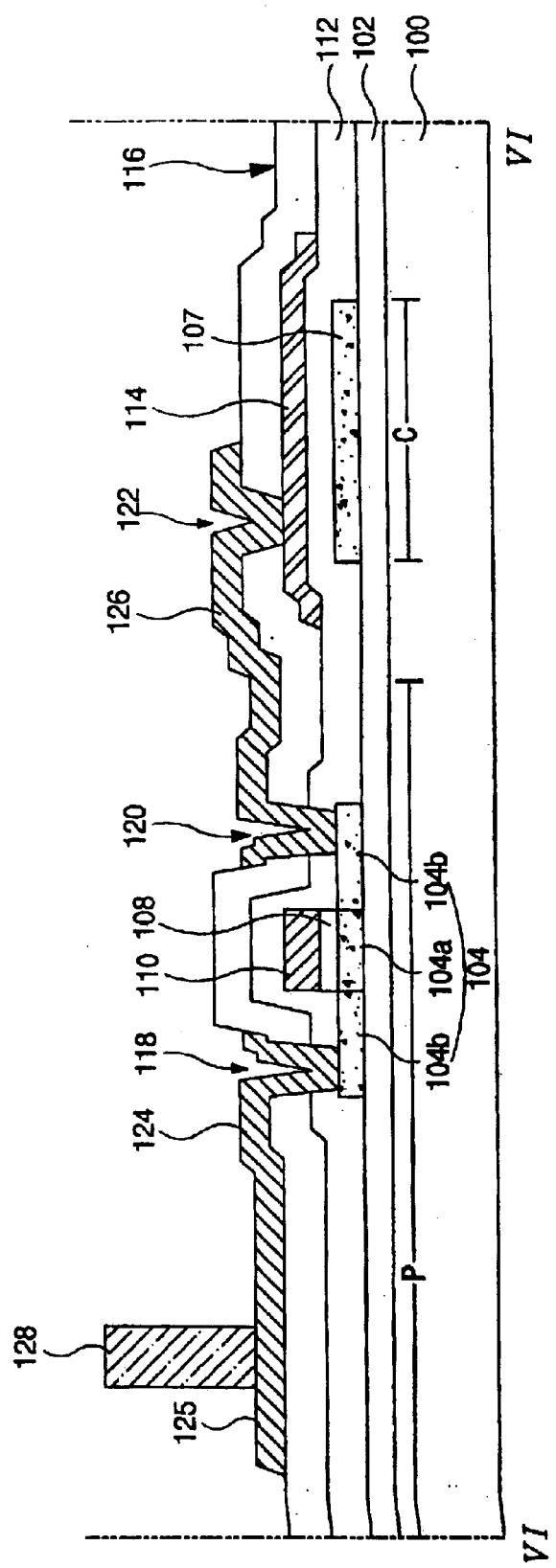

FIGS. 6A to 6C are cross sectional views along VI—VI of FIG. 5 and illustrating an exemplary fabrication process of a thin film transistor array part of an organic electroluminescent display (ELD) device according to the present invention. In FIG. 6A, a buffer layer 102 may be formed by depositing inorganic insulating materials, such as silicon nitride (SiNx) and silicon oxide ($SiO_2$), on a substrate 100 upon which a plurality of pixel regions "P" are defined. The substrate 100 includes the pixel regions "P," a switching area (not shown) occupied by the switching element $T_S$ of FIG. 5, a driving area "D" occupied by the driving element $T_D$ of FIG. 5, and a capacitor area "C." Active layers 104 and 106 (in FIG. 5) and the polycrystalline silicon active pattern 107 (in FIG. 5) may be formed by depositing amorphous silicon (a-Si:H) on the buffer layer 102, dehydrogenating the deposited amorphous silicon (a-Si:H), crystallizing dehydrogenated silicon into polycrystalline silicon layer, and then patterning the polycrystalline silicon layer. A gate insulating layer 108 may be formed by depositing inorganic insulating materials, such as silicon nitride (SiNx) and silicon oxide ($SiO_2$), onto a entire surface of the substrate 100. Alternatively, the gate insulating layer 108 may be etched to form individual gate insulating layers (not shown) that correspond to subsequently formed gate electrodes. A gate electrode 110 may be formed on the gate insulating layer 108 corresponding to the first active layer 104a. The second active layer 104b may be converted into an ohmic contact layer by doping impurities, such as boron group elements or phosphorus group elements. The gate electrode 110 may include one of aluminum (Al), aluminum alloys, copper (Cu), tungsten (W), tantalum (Ta), and molybdenum (Mo). An interlayer 112 may be formed over an entire surface of the substrate 100 upon which the gate electrode 110 is formed. A power line 114 may be formed over the active pattern 107 that is formed within the storage capacitor area "C" to deliver signals to the drain electrode (not shown) of the driving element, and may function as a second capacitor electrode.

In FIG. 6B, a first passivation layer 116 and a fourth insulating layer may be formed by depositing inorganic insulating materials, such as silicon nitride (SiNx) and silicon oxide (SiO$_2$), over entire surface of the substrate 100 upon which the power line 114 is formed.

Next, first, second, and third contact holes 118, 120, and 122 may be formed to expose portions of the second active layers 104b and the power line 114 by patterning first passivation layer 116. In addition, contact holes (not shown) that expose portions of the switching area (not shown) may also be simultaneously formed.

Figure 7:
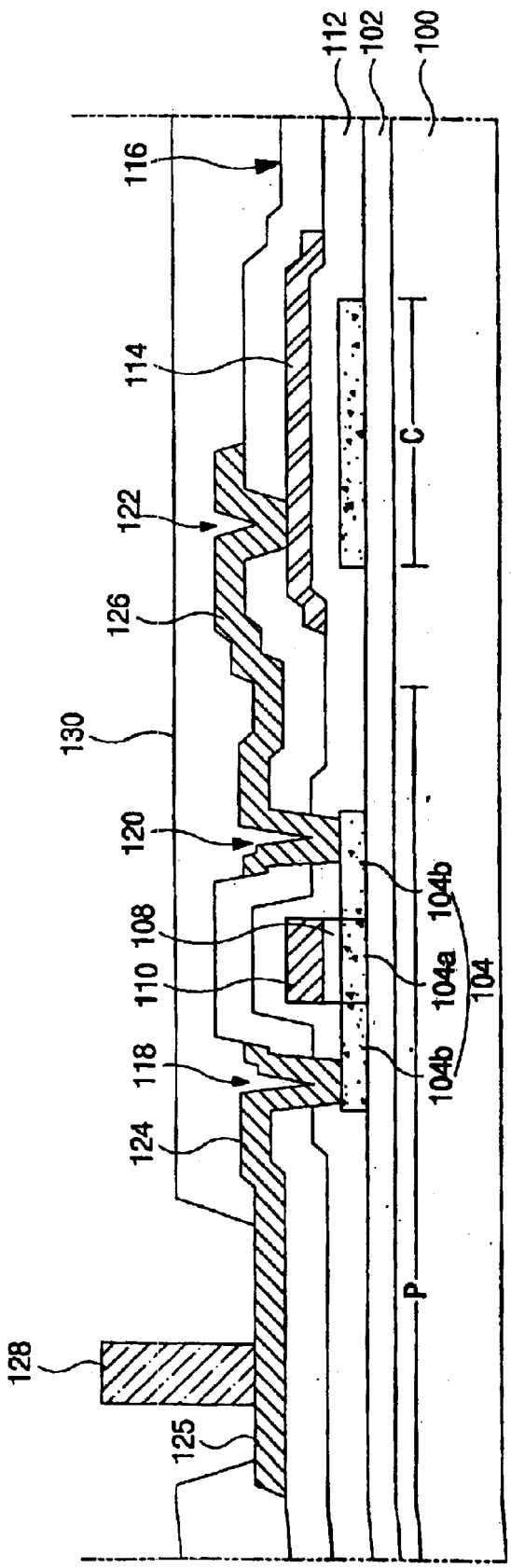
FIG. 7 is a cross sectional view of an exemplary thin film transistor array part of an organic electroluminescent display (ELD) device according to the present invention.

In FIG. 6C, source and drain electrodes 126 and 124 that contact the exposed portions of the second active layer 104b may be formed by depositing conductive metal materials, such as aluminum (Al), aluminum alloys, chromium (Cr), tungsten (W), and molybdenum (Mo), on the first passivation layer 116, and then patterning the conductive metal materials. The drain electrode 124 may be formed to contact one of the exposed portions of the second active layer 104b through the first contact hole 118, and may be formed to extend to the pixel regions "P" to form an extended portion 125. The source electrode 126 may be formed to contact one of the exposed portions of the second active layer 104b through the second contact hole and may contact the exposed portion of the power line 114 through the third contact hole 122. Although not shown, source and drain electrodes may be formed to contact exposed portions of the second active layer (not shown) of the switching area, and a data line may be formed to extend in parallel with the power line 114 from the source electrode. The drain electrode (not shown) of the switching element may be electrically connected to the gate electrode (not shown) of the driving element. The drain electrode 124 may include the extended portion 125 that extends from the drain electrode 124 to the pixel region "P," and a shape of the extended portion 125 may be modified. The contact electrode 128 may be formed on the extended portion 125 to contact the second electrode 210 of FIG. 4, and may be formed of a same material as the material used to form the second electrode 210 of FIG. 4. In addition, a fifth insulating layer formed on the driving element to protect the driving element, and a sixth insulating layer formed on the fifth insulating layer may not be necessary, thereby simplifying a fabrication process of the thin film transistor array part. However, an additional passivation layer 130 may alternatively be formed on the driving element to partially expose the extended portion 125 of the drain electrode 124, as shown in FIG. 7.

Figure 8A:
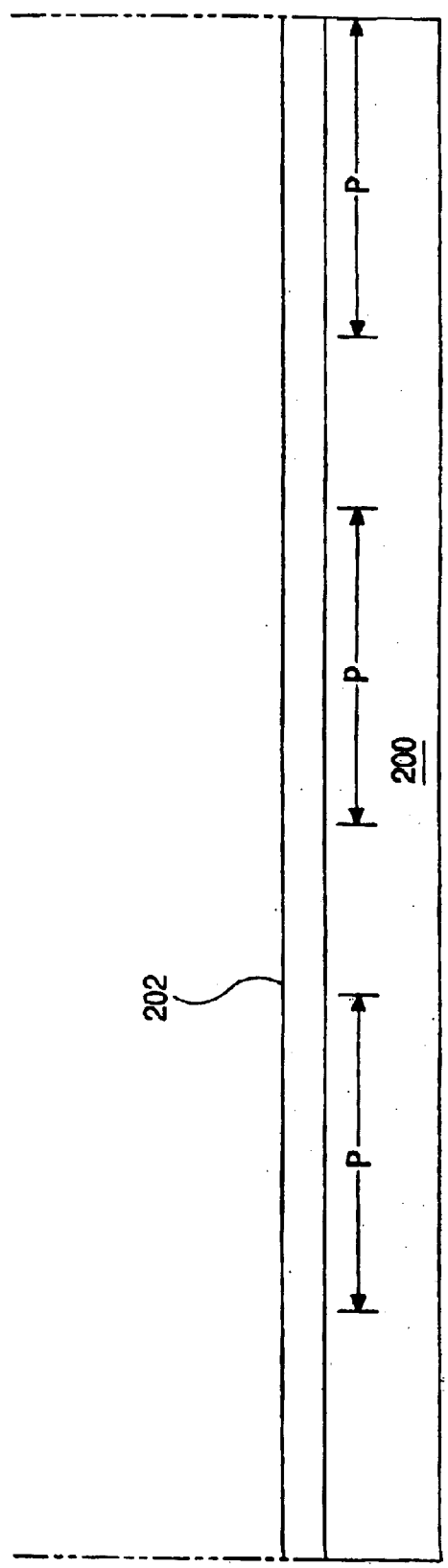
FIGS. 8A to 8C are cross sectional views of an exemplary fabrication process of a light-emitting part of an organic electroluminescent display (ELD) device according to the present invention.
Figure 8B:
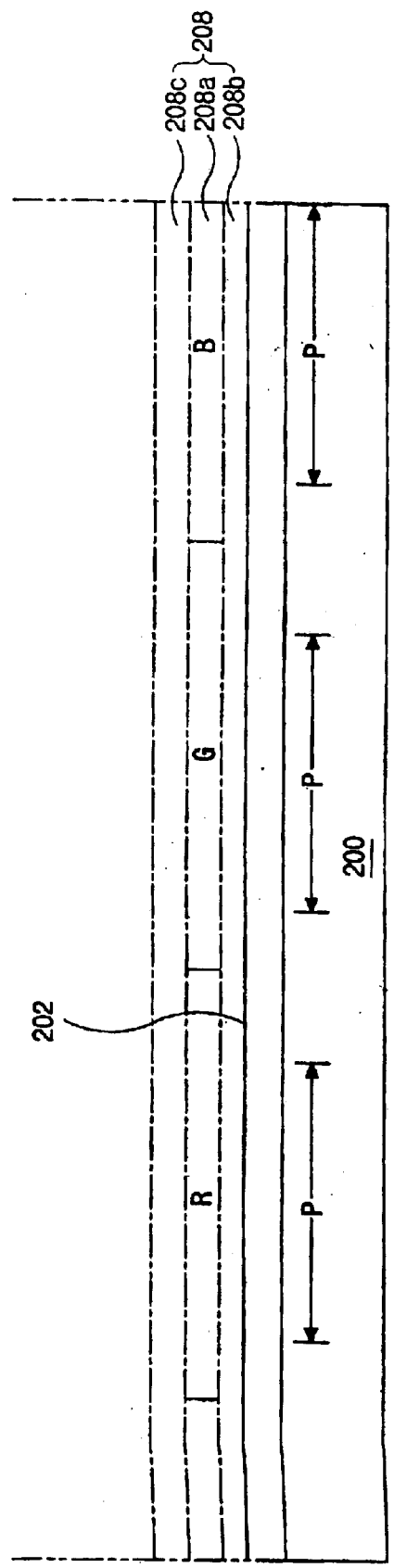
Figure 8C:
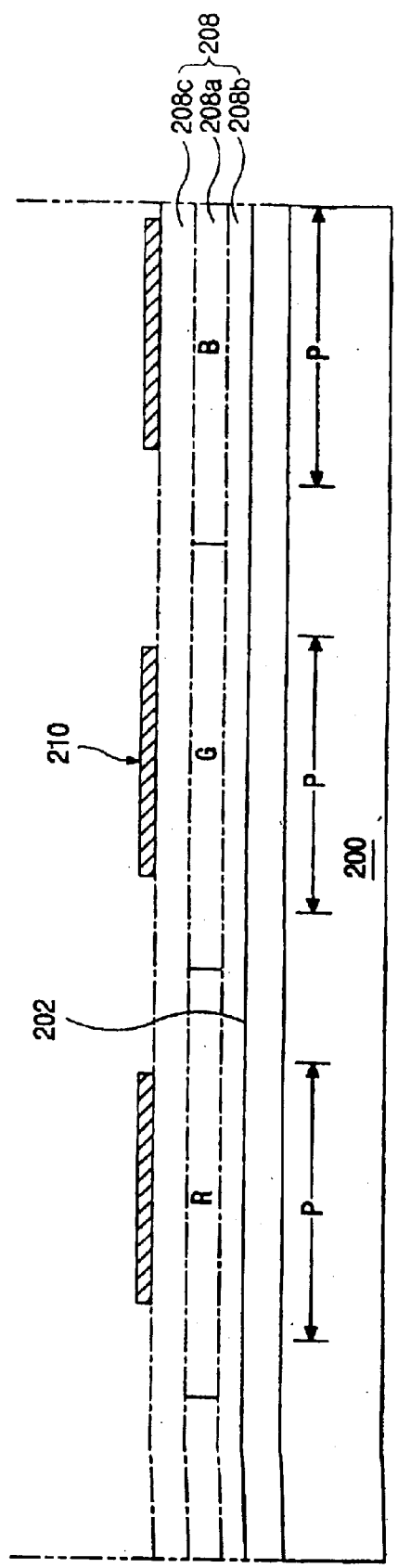

FIGS. 8A to 8C are cross sectional views of an exemplary fabrication process of a light-emitting part of an organic electroluminescent display (ELD) device according to the present invention. In FIG. 8A, a first electrode 202 may be formed on an entire surface of a substrate 200 to serves as an anode to input holes into a later-formed an organic light-emitting layer (not shown), wherein the first electrode 202 may include indium tin oxide (ITO) having a high work function.

In FIG. 8B, an organic light-emitting layer 208 may be divided into sections for R (red), G (green), and B (blue) and may be formed on the first electrode 202. Each section R, G, and B of the organic light-emitting layer 208 may correspond to each pixel region "P" to emit wavelengths of light of red, green, and blue colors. The organic light-emitting layer 208 may be formed as a single layer structure or as a multiple layer structure. If the organic light-emitting layer 208 is formed as a multiple layer structure, then the organic light-emitting layer 208 may include a main light-emitting layer 208a, a hole carrying layer 208b, and an electron carrying layer 208c.

FIG. 8C, a second electrode 210 may be formed on the organic light-emitting layer 208 to correspond to each pixel region "P." The second electrode 210 may include aluminum (Al), calcium (Ca), magnesium (Mg), or a double metal layer of lithium fluorine (LiF)/aluminum (Al), for example. The organic electro luminescent display (ELD) device of FIG. 4 may be fabricated by bonding the thin film transistor array part and the light-emitting part that have detailed above.

Figure 9:
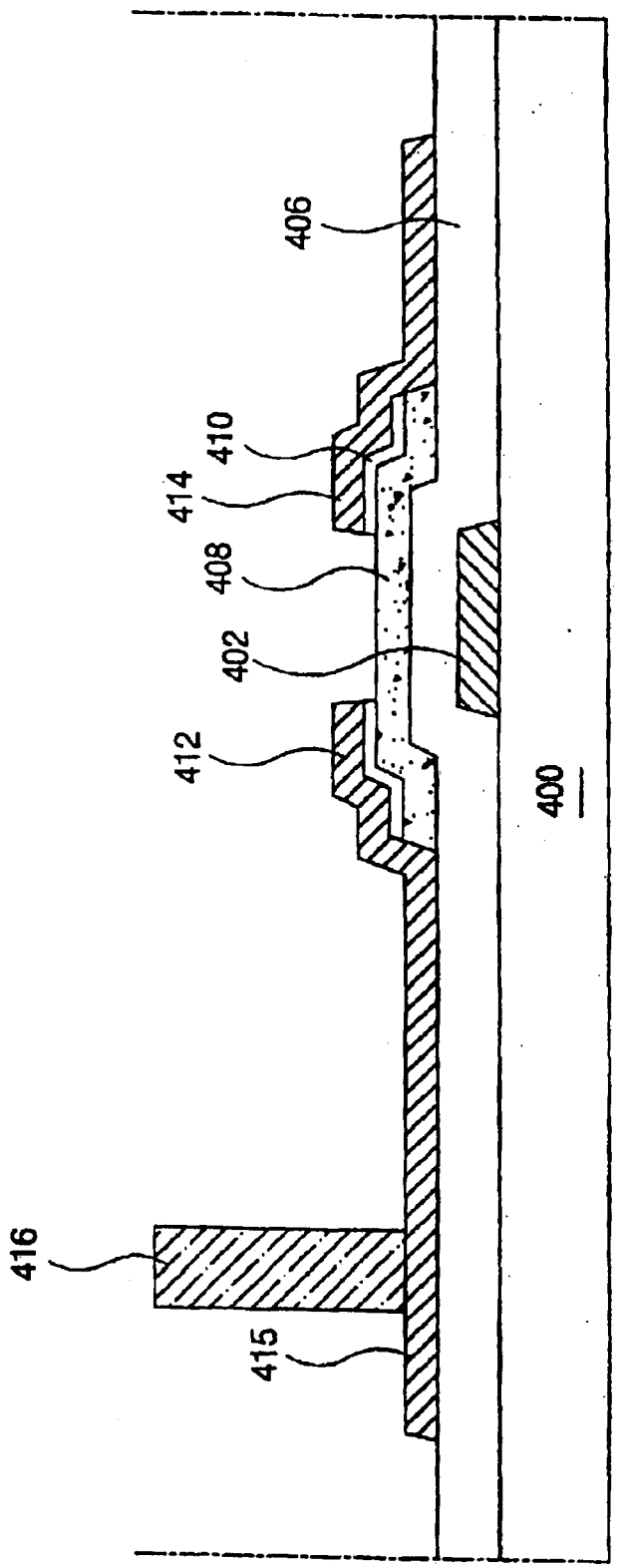
FIG. 9 is a cross sectional view of another exemplary thin film transistor array part of an organic electroluminescent display (ELD) device according to the present invention.

FIG. 9 is a cross sectional view of another exemplary thin film transistor array part of an organic electroluminescent display (ELD) device according to the present invention. In the exemplary thin film transistor array part of FIG. 9, amorphous silicon thin film transistors may be used for the switching element and the driving element. If amorphous silicon (a-Si:H) is used for an active layer of the driving element, a position where a gate electrode is formed may be different from the polycrystalline silicon that is used for the switching element and the driving element as detailed above. In addition, other structures may be same as those detailed above.

In FIG. 9, a gate electrode 402 may be formed on a substrate 400, and a gate insulating layer 406 may be formed over the gate electrode 402 by depositing inorganic insulating material, such as silicon nitride (SiNx) and silicon oxide (SiO$_2$), on an entire surface of the substrate 400 upon which the gate electrode 402 is formed. An active layer 408 and an ohmic contact layer 410 may be sequentially formed on the gate insulating layer 406 corresponding to the gate electrode 402. Source and drain electrodes 414 and 412 may be formed on the ohmic contact layer 410. The drain electrode 412 may be extended into the pixel region (not shown) to have an extended portion 415, and a shape of the extended portion 415 of the drain electrode 412 may be modified to assume many shapes. A contact electrode 416 may be formed on the extended portion 415 of the drain electrode 412.

Figure 10:
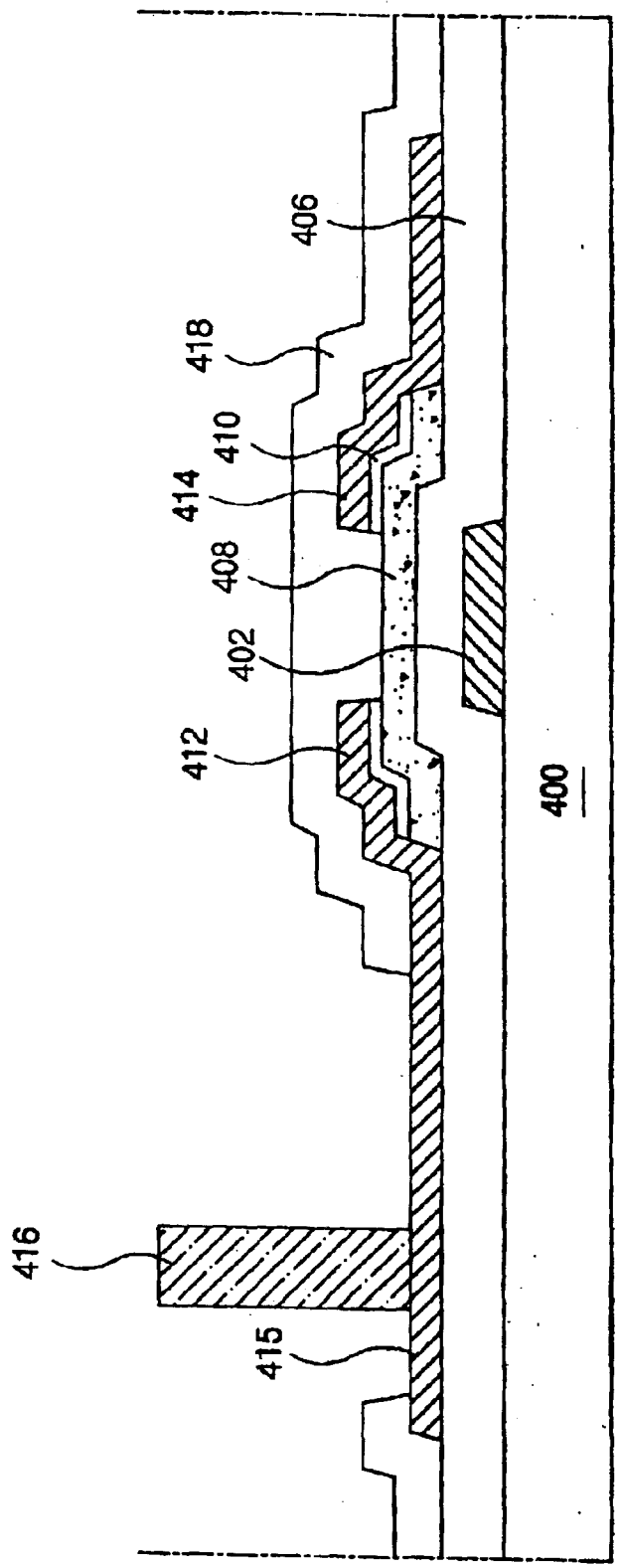
FIG. 10 is a cross sectional view of another exemplary thin film transistor array part of an organic electroluminescent display (ELD) device according to the present invention.

FIG. 10 is a cross sectional view of another exemplary thin film transistor array part of an organic electroluminescent display (ELD) device according to the present invention. In FIG. 10, an additional passivation layer 418 may further be formed on the whole substrate 400 of FIG. 8 upon which the source and drain electrodes 414 and 412 are formed. The passivation layer 418 may be patterned to expose a portion of the drain electrode 412 and a portion of the extended portion 415. The contact electrode 416 may be formed on the extended portion 415. Accordingly, a complete organic electroluminescent display (ELD) device may be fabricated by attaching the thin film transistor array part of FIG. 10 and the light-emitting part of FIGS. 8A to 8C.

The organic electro luminescent display (ELD) device of the present invention has advantages as follows. First, since the organic electroluminescent display (ELD) device is a top emission-type device and a shape of an array pattern under the light-emitting layer is not affected by the emitting light, a high aperture ratio can be obtained. Second, since the organic light-emitting layer is not formed on a same substrate with the thin film transistor array pattern, the organic light-emitting layer can be formed independently without considering the effect on the thin film transistor. Thus, a manufacturing yield can be increased. Third, since the drain electrode of the driving element is extended to the pixel region "P" and the extended portion of the drain electrode is electrically connected to the second electrode through the contact electrode, additional insulating layers may not be required to be formed over the driving element, and thus the manufacturing process can be simplified. Accordingly, a manufacturing yield can be increased due to the simplified method of fabricating the organic electroluminescent display (ELD) device.

It will be apparent to those skilled in the art that various modifications and variations can be made in the organic electroluminescent display device and method of fabricating the same of the present invention without departing from the spirit or scope of the invention. Thus, it is intended that the present invention cover the modifications and variations of this invention provided they come within the scope of the appended claims and their equivalents.

What is claimed is:

1. An organic electroluminescent display (ELD) device, comprising:
    a first substrate;
    a second substrate spaced apart and facing the first substrate;
    a plurality of switching thin film transistors and a plurality of driving thin film transistors interconnected on the first substrate, each of the switching thin film transistor and the driving thin film transistor having an active layer, a gate electrode, a source electrode, and a drain electrode, the drain electrode of the driving thin film transistor being extended to the pixel region to have an extended portion;
    a contact electrode contacting the extended portion of the drain electrode of the driving thin film transistor;
    a first electrode formed on the second substrate;
    an organic light-emitting layer on the first electrode; and
    a second electrode on the organic light-emitting layer.

2. The device according to claim 1, wherein the first electrode is an anode electrode that inputs holes into the organic light-emitting layer and the second electrode is a cathode electrode that inputs electrons into the organic light-emitting layer.

3. The device according to claim 2, wherein the first electrode includes indium tin oxide (ITO).

4. The device according to claim 2, wherein the second electrode includes one of calcium (Ca), aluminum (Al), and magnesium (Mg).

5. The device according to claim 1, wherein the contact electrode includes one of calcium (Ca), aluminum (Al), and magnesium (Mg).

6. The device according to claim 1, wherein the organic light-emitting layer further includes a hole-carrying layer adjacent to the first electrode and an electron-carrying layer adjacent to the second electrode.

7. The device according to claim 1, wherein the thin film transistor includes a polycrystalline silicon thin film-transistor.

8. The device according to claim 1, wherein the thin film transistor includes an amorphous silicon thin film transistor.

9. A method of fabricating an organic electroluminescent display (ELD) device, comprising steps of:
    defining a plurality of pixel regions on first and second substrates;
    forming a plurality of switching thin film transistors and a plurality of driving thin film transistors interconnected on the first substrate, the switching thin film transistor and the driving thin film transistor each having an active layer, a gate electrode, a source electrode, and a drain electrode, the drain electrode of the driving thin film transistor being extended to the pixel region to have an extended portion;
    forming a contact electrode contacting the extended portion of the drain electrode of the driving thin film transistor;
    forming a first electrode on the second substrate;
    forming an organic light-emitting layer on the first electrode;
    forming a second electrode on the organic light-emitting layer; and
    bonding the first and second substrates so that the contact electrode of the first substrate contacts the second electrode.

10. The method according to claim 9, wherein the first electrode is an anode electrode that inputs holes into the organic light-emitting layer and the second electrode is a cathode electrode that inputs electrons into the organic light-emitting layer.

11. The method according to claim 10, wherein the first electrode includes indium tin oxide (ITO).

12. The method according to claim 10, wherein the second electrode includes one of calcium (Ca), aluminum (Al), and magnesium (Mg).

13. The method according to claim 9, wherein the contact electrode includes one of calcium (Ca), aluminum (Al), and magnesium (Mg).

14. The method according to claim 9, wherein the organic light-emitting layer further includes a hole-carrying layer adjacent to the first electrode and an electron-carrying layer adjacent to the second electrode.

15. The method according to claim 9, wherein the thin film transistor includes a polycrystalline silicon thin film transistor.

16. The method according to claim 9, wherein the thin film transistor includes an amorphous silicon thin film transistor.

* * * * *